United States Patent [19]
Qureshi

[11] Patent Number: 5,689,466
[45] Date of Patent: Nov. 18, 1997

[54] BUILT IN SELF TEST (BIST) FOR MULTIPLE RAMS

[75] Inventor: Fazal Ur Rehman Qureshi, Cupertino, Calif.

[73] Assignee: National Semiconductor Corporation, Santa Clara, Calif.

[21] Appl. No.: 502,574

[22] Filed: Jul. 14, 1995

Related U.S. Application Data

[63] Continuation-in-part of Ser. No. 418,499, Apr. 7, 1995, abandoned.

[51] Int. Cl.$^6$ .................................................. G11C 7/00
[52] U.S. Cl. ............................. 365/201; 365/236
[58] Field of Search ............................. 365/201, 236, 365/230.01, 189.07; 371/21.1, 21.2

[56] References Cited

U.S. PATENT DOCUMENTS

| | | | |
|---|---|---|---|
| 4,061,908 | 12/1977 | Jonge et al. | 365/201 |
| 5,381,373 | 1/1995 | Ohsawa | 365/236 |
| 5,475,815 | 12/1995 | Byers | 365/201 |

FOREIGN PATENT DOCUMENTS

| | | |
|---|---|---|
| 2296247 | 7/1976 | France . |
| 86/01036 | 2/1986 | WIPO . |
| 88/09554 | 12/1988 | WIPO . |

Primary Examiner—A. Zarabian
Attorney, Agent, or Firm—Limbach & Limbach L.L.P.

[57] ABSTRACT

Multiple embedded RAMs are tested, one at a time, for stuck at faults, including multibit faults. Parity for the RAMs is also tested and tests are performed for marginal read/write problems by changing clock frequency. A lockup mechanism yields the failing address. To accomplish the test, the RAM write address is written as data and then read back. Since the address is written as data, the expected result in a read operation is known. Thus, failures are predicted by comparing the reference address in a read cycle with the data read from the RAM. This operation is then repeated by writing the inverse write address as data. Through the two sets of write/read/compare operations, every RAM bit is toggled. After performing the two operations for one RAM, the procedure is repeated for each RAM until all have been tested. In a second embodiment, multiple embedded RAMs are tested simultaneously with the same address and data lines going to all RAMs. As with the first embodiment, testing is for stuck at faults, including multibit faults; parity for the RAMs is also tested as re marginal read/write problems. The data patterns include the write address as data, inverse write address as data, or random data. In the second embodiment, the same data is simultaneously written into multiple RAMs, followed by a read/compare cycle. The comparison determines whether there is an error. As in the first embodiment, a look-up mechanism yields the failing address. Since, in this second embodiment, it does not matter what data is written to the RAMs, this embodiment provides the additional capability of utilizing random data to test for additional fault conditions.

12 Claims, 5 Drawing Sheets

| | | |
|---|---|---|
| EBIST | R/W | =1, bist is enabled |
| | | =0, bist is disabled |
| RAMaddress | R | Location where the failure occured, a read will yield failing bits. |
| ERST | R/W | Enable software reset. |
| LOCKUP | R/W | =1, lockup mode is enabled |
| | | =0, lockup mode is disabled |
| BERROR | R/W | =1, Bist run had a failure |
| | | =0, Bist run had no failure |

FIG. 3

BUILT IN SELF TEST (BIST) FOR MULTIPLE RAMS

RELATED APPLICATION

This is a Continuation-In-Part of application Ser. No. 08/418,499, filed on Apr. 7, 1995, abandoned. Sep. 8, 1995, by Fazal Ur Rehman Qureshi for Built In Self Test (BIST) For Multiple RAMs.

BACKGROUND OF THE INVENTION

1. Field of the Invention

The present invention relates to the testing of integrated circuits and, in particular, to a built in self test (BIST) technique for determining the existence of "stuck at" faults and marginal read/write problems in multiple embedded random access memory (RAM) elements.

2. Discussion of the Relevant Art

In many integrated circuit technologies, a short between ground or the power supply and a signal line can cause the signal to be "stuck at" a fixed voltage level. Built in self test (BIST) is a circuit design technique in which elements of the circuit are used to test the circuit itself to identify, for example, stuck at faults.

Conventional BIST designs are typically capable of testing only one embedded RAM and utilize relatively complex techniques for generating data and predicting failure, usually involving collection of a signature for analysis. Furthermore, most BIST designs do not provide for detection of multibit faults.

It would, therefore, be highly desirable to have available a BIST design for testing multiple embedded RAMs for stuck at faults, including multibit faults, while parity for the RAMs and marginal read/write problems are also tested.

SUMMARY OF THE INVENTION

In accordance with a first embodiment of the present invention, multiple embedded RAMs are sequentially tested for stuck at faults, including multibit faults. Parity for the RAMs is also tested and marginal read/write problems are tested by changing clock frequency. A lockup mechanism yields the identity of the failed bits. A counter is utilized to iteratively cycle through the full address range of a RAM under test, performing write/read/compare operations. After one RAM has been tested, the counter increments to select another RAM for testing. This procedure is repeated until all on-chip RAMs have been tested.

In the first embodiment, the RAM write address is written as data and then read back. Since the address is written as data, the expected result is known. Thus, failures are predicted by comparing the reference address in a subsequent read operation with the data read from the RAM. The write/read/compare operation is then repeated by writing the inverse address as data through the full RAM address range. Through these set two sets of operations, i.e., write address as data and inverse write address as data, every RAM bit is toggled. Marginal read/write problems can be tested by performing the two operations again at different frequencies. As stated above, after performing the two operations for one RAM, the procedure is repeated for each RAM until all have been tested.

In accordance with a second embodiment of the invention, multiple embedded RAMs are tested simultaneously with the same address and data lines going to all RAMs. As with the first embodiment, testing is for stuck at faults, including multibit faults; parity for the RAMs is also tested, as are marginal read/write problems. The data patterns include the write address as data, inverse write address as data, or random data. Since all RAMs are tested simultaneously, the RAM select field of the counter is not needed.

In the second embodiment, data is written simultaneously into the full address range of multiple RAMs, followed by a read/compare cycle. The comparison determines whether there is an error, relying on the extremely high probability that more than one RAM will not fail in the same way at the same bit at the same address. As in the first embodiment, a lockup mechanism yields the failing address. Since, in this second embodiment, it does not matter what data is written to the RAMs, this embodiment provides the additional capability of optionally utilizing random data to test for additional fault conditions.

A better understanding of the features and advantages of the present invention will be obtained by reference to the following detailed description and accompanying drawings which set forth illustrative embodiments in which the principles of the invention are utilized.

BRIEF DESCRIPTION OF THE DRAWINGS

FIG. 3 is a table identifying the bits of a test access register utilizable in performing a BIST operation in accordance with the present invention.

DETAILED DESCRIPTION OF THE INVENTION

Figure 1:
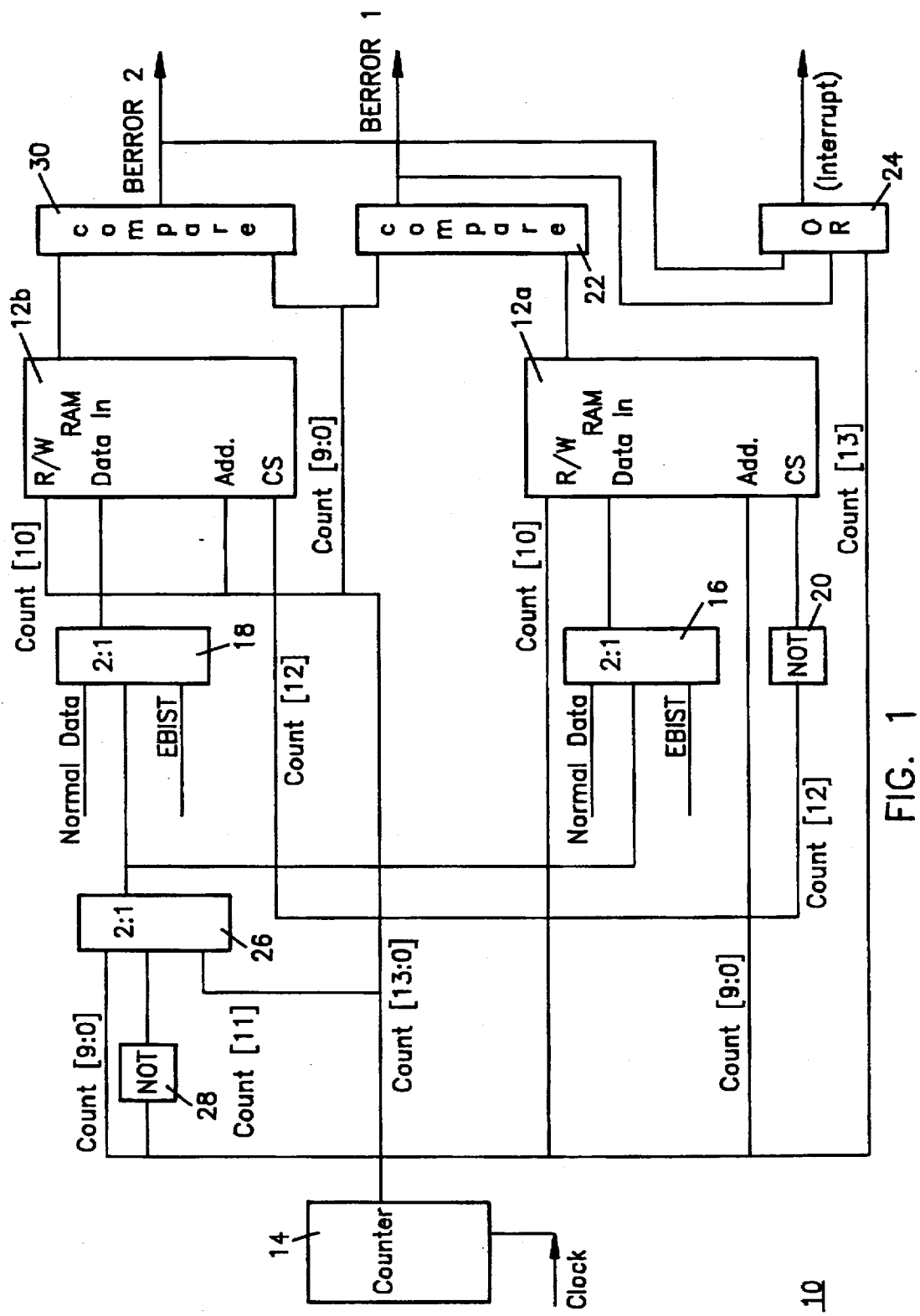
FIG. 1 is a block diagram illustrating a BIST circuit for testing multiple RAMs, one at a time, in accordance with a first embodiment of the present invention.

FIG. 1 shows a built in self test (BIST) circuit 10 for testing multiple embedded random access memory (RAM) blocks 12a and 12b, one at a time, in accordance with a first embodiment of the present invention. Although only two RAM blocks are shown in FIG. 1, it is intended that circuit 10 be representative of an application that includes any number of RAM blocks in a single integrated circuit device. Those skilled in the art will appreciate that if more than two RAM blocks are included, each additional RAM block will include address, data and control circuitry similar to that shown in FIG. 1 for the two illustrated RAM blocks 12a and 12b.

Those skilled in the art will also appreciate that the inventive concepts set forth herein are not limited to BIST for RAM structures, but apply to any addressable integrated circuit storage device.

Figure 2:
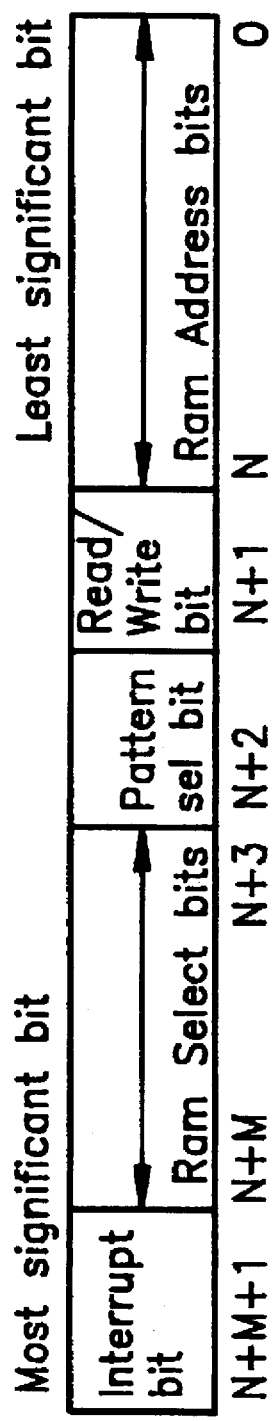
FIG. 2 is a schematic representation of the bit utilization of a counter utilizable in performing a BIST operation in accordance with the present invention.

The heart of the FIG. 1 BIST circuit 10 is a counter 14 that has the utilization breakdown shown in FIG. 2 for its bits as it counts from zero to its full value. More specifically, counter bits [N:0] define the RAM depth in that these bits provide the RAM address range, bit 0 being the least significant bit (LSB). Counter bit [N+1] determines whether the current operation within the BIST cycle is a write (=0) or a read (=1) operation. Counter bit [N+2] determines the write data pattern; that is, as described below, when counter bit [N+2]=0, then the write address is provided as input data to the selected RAM block and parity is odd and when counter bit [N+2]=1, then the inverse write address is provided as input data and parity is even. Counter bits [N+M:N+3] identify which one of the multiple embedded RAMs is to be operated upon. Counter bit [N+M+1], i.e. the most significant bit (MSB), gives rise to an interrupt when set, signaling the end of a BIST test cycle.

FIG. 1 shows a BIST operation in accordance with the first embodiment of the invention wherein the ten lower bits of the counter 14, i.e. counter bits [9:0], define the RAM address range. The BIST operation is initiated by setting an EBIST bit active. The EBIST bit may be set in a test access register of a microprocessor interface (not shown) associated with the BIST circuit 10. FIG. 3 provides a bit description of a suitable test access register. As shown in the FIG. 3 bit table, a read/write EBIST bit may be utilized to enable BIST operations for all embedded RAMs to be tested. The EBIST bit automatically masks out all interrupts, initiates the BIST operation and then automatically removes the masks for all other interrupts when the BIST operation is completed.

Setting the EBIST bit in the test access register resets counter 14 and causes the two 2:1 multiplexers 26 and 18 to provide the write address bits of the counter 14, i.e. counter bits [9:0], as the input data to the RAM blocks 12a and 12b, respectively. Driven by its clock input signal, the counter 14 then begins to count from zero to its full value. Thus, initially, both counter bit [10] and counter bit [11] are zero, designating a write operation utilizing the write address as data. These conditions will hold for a full cycle through the RAM address range. Since counter bit [12] is also initially zero, and assuming that chip select (CS) for the two RAM BLOCKS 12a and 12b is active high, RAM block 12b will be initially disabled and NOT logic 20 will cause RAM block 12a to be selected for the initial BIST testing operation.

First, the entire address range of RAM block 12a is written with the write address as input data. After RAM block 12a has been fully written, counter bit [10] shifts from value "0" to value "1", thereby designating a read operation. Counter bits [9:0] then again cycle through the entire address range of RAM block 12a. As shown in FIG. 1, during the read cycle, each reference read address applied to RAM block 12a will also be applied as an input to the compare circuit 22 associated with RAM block 12a. Since the data stored in the read-referenced RAM storage location is the reference address of that location, the output of RAM block 12a should also provide the reference address as an input to the compare circuit 22. Thus, if compare circuit 22 detects any mismatch between the output of RAM block 12a and the current reference address as the counter cycles through the RAM address range, it provides an active output signal to OR logic 24 which, in turn, issues an interrupt signal to the associated host processor, thereby "locking up" the counter 14 at the reference address that caused the interrupt to be generated. Whenever a comparison failure is detected, the BIST operation is halted and the output BERROR1 of the compare circuit 22 is written to a read/write bit BERROR of the test access register. The test access register also includes a read/write lockup bit LOCKUP which, if set, enables a lockup mode. In the lockup mode, when the BIST operation is halted based on detection of a comparison failure by the BIST circuit 10, the address of the failed RAM storage location is provided to the test access register (RAMaddress). A read of the test access register will then yield the identity of the failed bits in the RAM block under test. After the failure details have been established, the test cycle can be restarted at the count value held by the counter 14 at "lockup" by resetting the BERROR bit in the test access register. If the LOCKUP bit has not been set, then no additional information beyond a pass/fail result is available upon detection of a comparison mismatch.

After the above-described write/read/compare operation has been performed for the entire RAM address range, counter bit [11] shifts from value "0" to value "1" and the above-described write/read/compare operation is performed again utilizing the inverse write address as input data to RAM block 12a. As shown in FIG. 1, in the illustrated embodiment, this is accomplished by providing counter bit [11] as the select signal to multiplexer 26, which responds to counter bit [11]=1 by providing the inverse write address provided by Not inverter 28 as its output.

After each bit of RAM block 12a has been toggled through a write/read/compare operation utilizing both the write address as data and the inverse write address as data, counter bit [12] shifts from value "0" to value "1", thereby causing RAM block 12b to be selected and RAM block 12a to be deselected. The above-described write/read/compare operations are then performed on RAM block 12b utilizing first the write address as input data and then the inverse write address as input data.

After both RAM block 12a and RAM block 12b have been fully tested, the MSB of counter 14, i.e. counter bit [13], shifts from value "0" to value "1", causing OR gate 24 to issue an interrupt signaling end of test.

Of course, those skilled in the art will appreciate that by expanding the width of the RAM select bit field in counter 14 as desired, any number of embedded RAM blocks can be sequentially tested in the manner described above.

Figure 4:
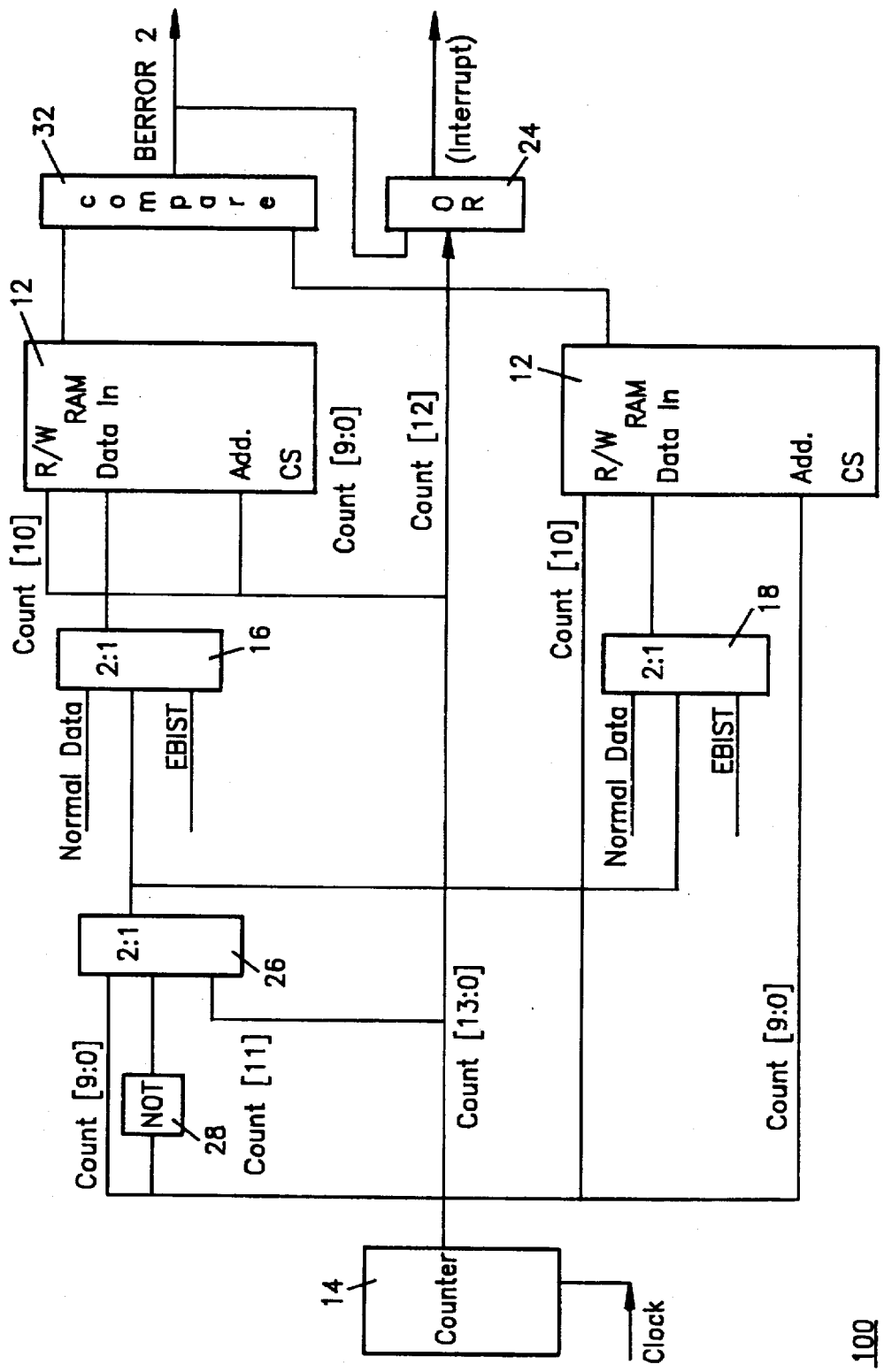
FIG. 4 is a block diagram illustrating a BIST circuit for simultaneously testing multiple RAMs simultaneously in accordance with a second embodiment of the present invention, utilizing the write address as input data to the device under test.

FIG. 4 shows a second circuit embodiment 100 of the invention wherein the two RAM blocks 12a and 12b are tested simultaneously. Again, the counter 14 drives the test, as described above with respect to the FIG. 1 embodiment, as it counts up to full value from zero. The difference in this case is that both RAM blocks 12a and 12b are selected simultaneously; that is, the RAM select bit field of counter 14 in the first embodiment is not needed. In the second embodiment, counter bit [12] becomes the interrupt bit that, when shifted from value "0" to value "1", causes OR gate 24 to issue an interrupt output signaling end of test. Also, since both RAM blocks 12 have been simultaneously written with the same write address in any given cycle of the write operation, it is possible to compare the RAM block outputs provided during the read operation to identify a comparison failure. The test relies on the fact that it is extremely improbable that more than one RAM under test will fail in the same way at the same bit at the same address. Any compare mismatch indicates a bit failure in at least one of the RAM blocks under test. This requires only one compare circuit 32, the output of which also drives OR gate 24 to generate the interrupt signal.

Figure 5:
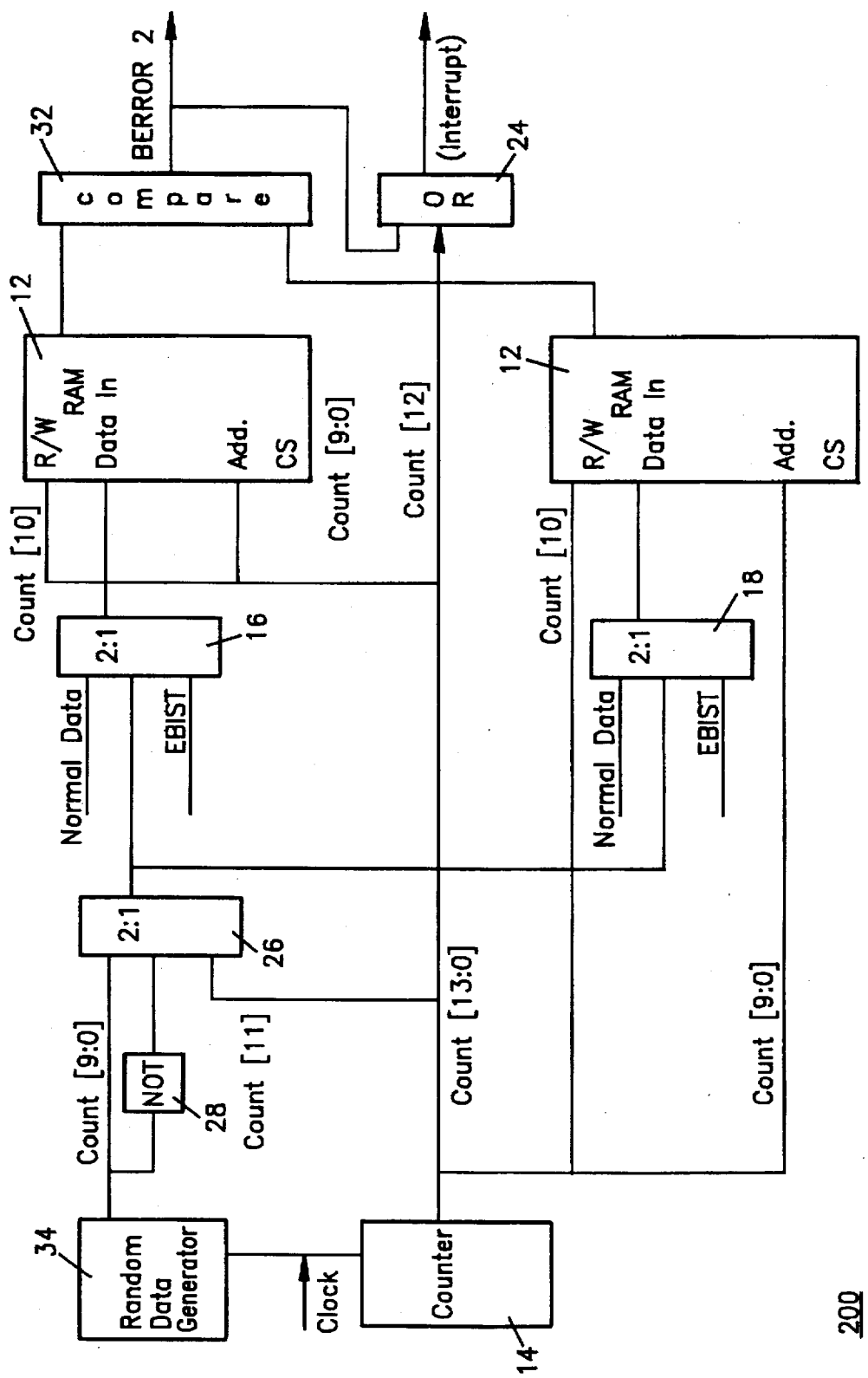
FIG. 5 is a block diagram illustrating a BIST circuit in accordance with the second embodiment of the invention, utilizing random input data to the devices under test.

As shown in the FIG. 5 circuit 200, since the FIG. 4 embodiment of the invention relies upon a comparison of the outputs of the two RAM blocks 12a and 12b, rather than upon a comparison of a RAM output and the current reference address as in the FIG. 1 embodiment, random data provided by random data generator 34 can be utilized as the simultaneous write data input to the RAM blocks 12a and 12b. Use of random input data provides the capability to test for non-stuck at faults (e.g. adjacency and cross-talk tests).

Again, one skilled in the art will clearly appreciate that the second embodiment of the invention can accommodate any number of RAM blocks 12.

The user can also perform characterization tests on the RAM blocks. During a BIST operation, the clock for all the RAM blocks is the same. Thus, the user is able to establish upper and lower limits on RAM performance by adjusting clock speed externally.

It should be understood that various alternatives to the embodiments of the invention described herein may be employed in practicing the invention. It is intended that the following claims define the scope of the invention and that methods and circuits within the scope of these claims and their equivalents be covered thereby.

What is claimed is:

1. A built in self test (BIST) method for simultaneously testing a plurality of addressable integrated circuit storage devices that are all connected to a common address bus and a common input data bus, the BIST method comprising:

providing a counter that has a utilization as follows for bits of said counter as said counter counts from zero to a full value of said counter: counter bits (N:0) define a full address range of each addressable integrated circuit storage device provided on the common address bus, counter bit (0) being a least significant bit; counter bit (N+1) determines whether a current operation within a BIST cycle is a write operation or a read operation; counter bit (N+2) determines whether a write address or an inverse write address is provided as input data on the common input data bus; and counter bit (N+3) initiates an end of test interrupt signal, wherein N is an integer greater than zero; and initiating said counter to count at a first frequency from zero to the full value of said counter such that, (a) the full address range of each of the plurality of addressable integrated circuit storage devices is simultaneously written with selected input data;

(b) following (a) above, a read operation is simultaneously performed on the full address range of each of the addressable integrated circuit storage devices and, for each reference read address in the full address range, a read output of each of the addressable integrated circuit storage devices is compared with a read output of the other addressable integrated circuit storage devices;

(c) in the event the comparison in (b) above results in a mismatch, generating an interrupt signal; and repeating the above-recited steps while operating said counter at a second frequency different from the first frequency.

2. A method as in claim 1 and further comprising performing steps (a)–(c) in claim 6 utilizing inverse selected input data.

3. A BIST method as in claim 1 and further comprising, in the event that said interrupt signal is generated, providing the reference read address and the identity of said failed addressable memory structure as an output.

4. A BIST method as in claim 1 wherein the addressable memory structure is a random access memory (RAM).

5. A BIST method as in claim 1 wherein the selected input data is the write address.

6. A built in self test (BIST) method for sequentially testing a plurality of addressable integrated circuit storage devices, the BIST method comprising:

providing a counter that has a utilization as follows for bits of said counter as said counter counts from zero to a full value of said counter: counter bits (N:0) define a full address range of each of said addressable integrated circuit storage devices, counter bit (0) being a least significant bit; counter bit (N+1) determines whether a current operation within a BIST cycle is a write operation or a read operation; counter bit (N+2) determines whether the write address or the inverse write address is provided as input data; counter bits (N+M:N+3) identify which one of the plurality of addressable integrated circuit storage devices is to be operated upon; and counter bit (N+M+1) initiates an end of test interrupt signal, wherein N is an integer greater than zero and M is an integer greater than zero;

initiating said counter to count from zero to the full value of said counter such that, (a) the full address range of said addressable integrated circuit storage device currently to be operated upon is written with the write address as input data;

(b) following step (a) above, a read operation is performed on the full address range of said addressable integrated circuit storage device and, for each reference read address in the full address range, a read output of said addressable integrated circuit storage device is compared with said reference read address; and (c) in the event there is a mismatch between said read output and said reference read address, generating an interrupt signal; and responding to the generation of said interrupt signal by locking up the counter at the reference address that caused said interrupt signal to be generated.

7. A method as in claim 6 and further comprising the step of, in response to the locking up of the counter, providing the reference address that caused said interrupt signal to be generated to a test access register.

8. A method as in claim 7 and further comprising the step of accessing the test access register to identify the reference address.

9. A method as in claim 8 and further comprising reinitiating said counter to count from the counter value corresponding to the reference address.

10. A built in self test (BIST) method for sequentially testing a plurality of addressable integrated circuit storage devices, the BIST method comprising:

providing a counter that has a utilization as follows for bits of said counter as said counter counts from zero to a full value of said counter: counter bits (N:0) define a full address range of each addressable integrated circuit storage device, counter bit (0) being a least significant bit; counter bit (N+1) determines whether a current operation within a BIST cycle is a write operation or a read operation; counter bit (N+2) determines whether the write address or the inverse write address is provided as input data; counter bits (N+M:N+3) identify which one of the plurality of addressable integrated circuit storage devices is to currently be operated upon; and counter bit (N+M+1) initiates an end of test interrupt signal, wherein N is an integer greater than zero and M is an integer greater than zero;

initiating said counter to count at a first frequency from zero to the full value of said counter such that, (a) the full address range of the addressable integrated circuit storage device currently being operated upon is written with the write address as input data;

(b) following step (a) above, a read operation is performed on the full address range of the selected addressable memory structure and, for each reference read address in the full address range, a read output of the addressable integrated circuit storage device currently being operated upon is compared with said reference read address;

(c) in the event there is a mismatch between said read output and said reference read address, generating an interrupt signal;

iteratively performing the above-recited steps for each of the plurality of addressable integrated circuit storage devices; and repeating the above-recited steps while operating said counter at a second frequency different from the first frequency.

11. A method as in claim 10 and comprising the further step of iteratively repeating the above-recited steps while operating said counter at a different frequency for each iterative repetition of said steps.

12. A built in self test (BIST) method for simultaneously testing a plurality of addressable integrated circuit storage devices that are all connected to a common address bus and a common input data bus, the BIST method comprising:

providing a counter that has a utilization as follows for bits of said counter as said counter counts from zero to a full value of said counter: counter bits (N:0) define a full address range of each addressable integrated circuit storage device provided on the common address bus, counter bit (0) being a least significant bit; counter bit (N+1) determines whether a current operation within a BIST cycle is a write operation or a read operation; counter bit (N+2) identifies that random data is provided as input data on the common input data bus; and counter bit (N+3) initiates an end of test interrupt signal, wherein N is an integer greater than zero; and initiating said counter to count at a first frequency from zero to the full value of said counter such that, (a) the full address range of each of the plurality of addressable integrated circuit storage devices is simultaneously written with selected input data;

(b) following (a) above, a read operation is simultaneously performed on the full address range of each of the addressable integrated circuit storage devices and, for each reference read address in the full address range, a read output of each of the addressable integrated circuit storage devices is compared with a read output of the other addressable integrated circuit storage devices; and (c) in the event the comparison in (b) above results in a mismatch, generating an interrupt signal.

* * * * *

UNITED STATES PATENT AND TRADEMARK OFFICE
CERTIFICATE OF CORRECTION

PATENT NO. : 5,689,466
DATED : November 18, 1997
INVENTOR(S) : Fazal Ur Rehman Qureshi It is certified that error appears in the above-identified patent and that said Letters Patent is hereby corrected as shown below:

In Col. 5, line 53, delete "6" and replace with --1--.

Signed and Sealed this

Tenth Day of February, 1998

Attest:

BRUCE LEHMAN

*Attesting Officer*  *Commissioner of Patents and Trademarks*